United States Patent [19]

Nakao

[11] Patent Number: 4,937,434
[45] Date of Patent: Jun. 26, 1990

[54] HEAT TREATMENT APPARATUS AND HEAT TREATMENT METHOD
[75] Inventor: Ken Nakao, Sagamihara, Japan
[73] Assignee: Tel Sagami Limited, Kanagawa, Japan
[21] Appl. No.: 312,500
[22] Filed: Feb. 21, 1989
[30] Foreign Application Priority Data Feb. 24, 1988 [JP] Japan .................. 63-39597

[51] Int. Cl.⁵ .................. H01L 21/26; F27B 1/09
[52] U.S. Cl. .................. 219/390; 219/411; 118/729; 118/50.1
[58] Field of Search ............ 219/390, 405, 411, 354; 118/725, 729, 50.1

[56] References Cited
U.S. PATENT DOCUMENTS

| 3,311,694 | 3/1967 | Lasch | 219/390 |
| 3,385,921 | 5/1968 | Hampton | 219/390 |
| 4,061,870 | 12/1977 | Mizushina | 373/136 |
| 4,423,516 | 12/1983 | Mellen | 219/390 |
| 4,539,933 | 9/1985 | Campbell | 118/725 |
| 4,558,660 | 12/1985 | Nishizawa | 219/411 |
| 4,605,161 | 8/1986 | Motomiya | 219/388 |
| 4,711,989 | 12/1987 | Yu | 219/411 |

Primary Examiner—Teresa J. Walberg
Attorney, Agent, or Firm—Oblon, Spivak, McClelland, Maier & Neustadt

[57] ABSTRACT

In a heat treatment apparatus, a temperature measuring element is arranged to be movable along an arrangement direction of a large number of objects placed in a process tube. A temperature distribution of a heat treatment area inside the process tube can be continuously measured by this temperature measuring element with high accuracy. As a result, internal temperature control of the process tube can be facilitated with high precision.

9 Claims, 4 Drawing Sheets

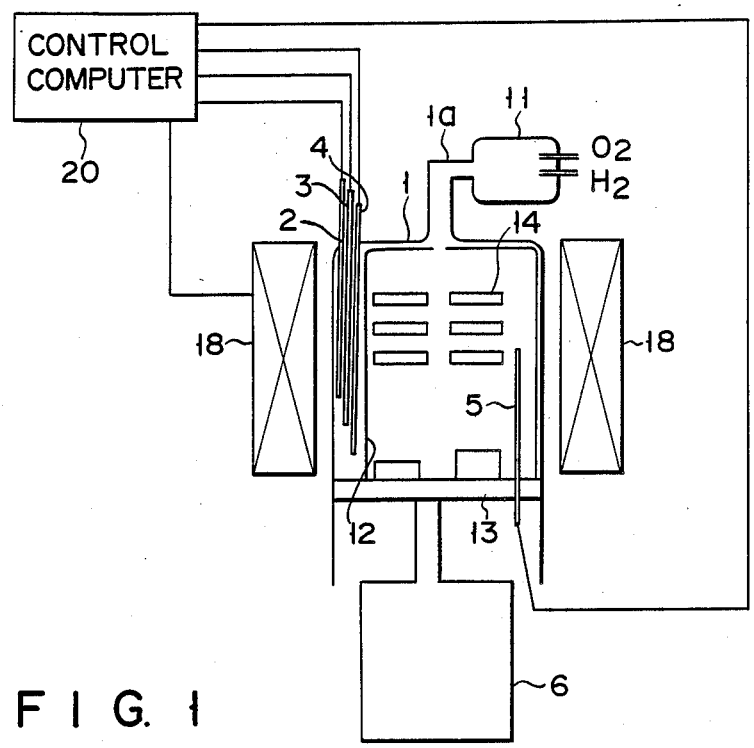
F I G. 1
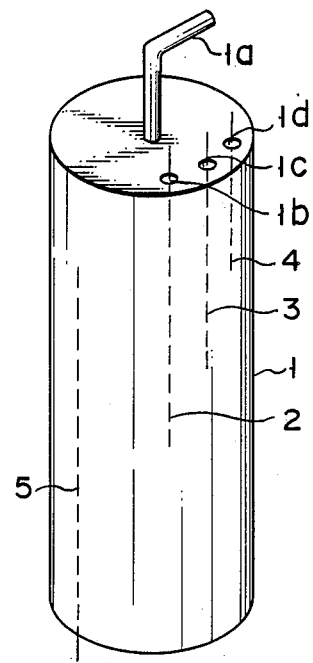
F I G. 2

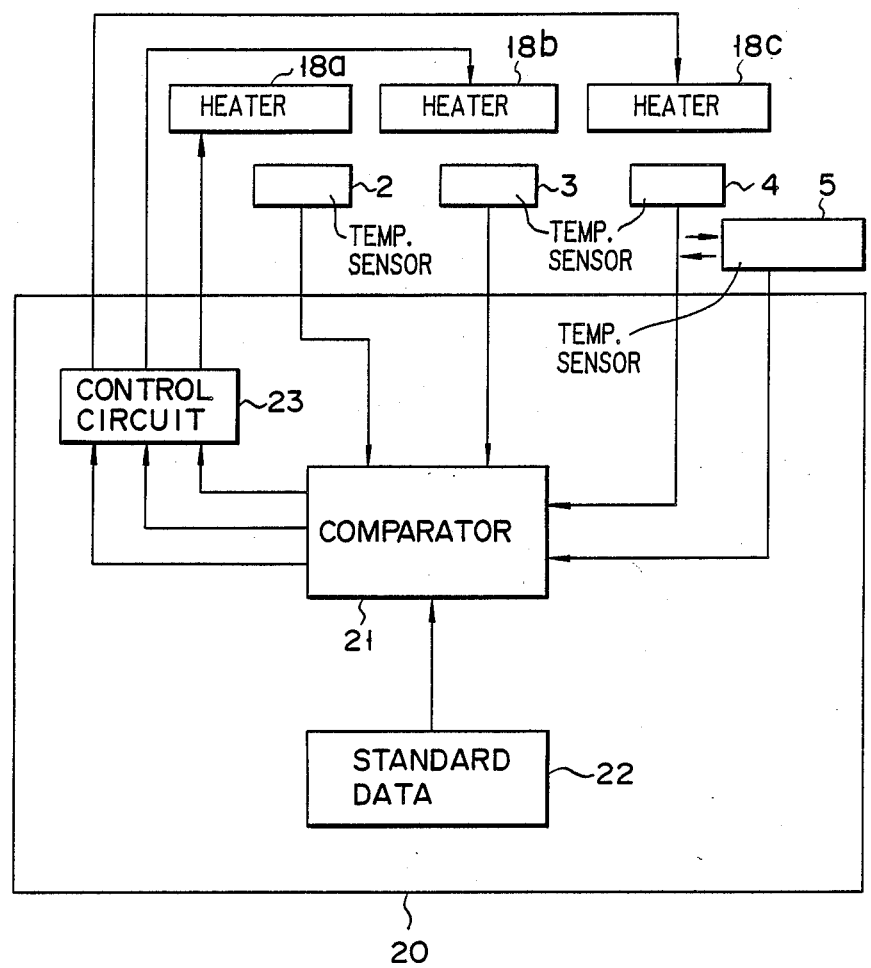
F I G. 7

HEAT TREATMENT APPARATUS AND HEAT TREATMENT METHOD

BACKGROUND OF THE INVENTION

1. Field of the Invention

The present invention relates to a heat treatment apparatus and a heat treatment method.

2. Description of the Related Art

Heat treatment apparatuses have been used in fabrication of, e.g., semiconductor devices. These heat treatment apparatuses include horizontal type apparatuses and vertical type apparatuses. A large number of objects subjected to a treatment, e.g., a large number of wafers or a wafer are placed in columns or a column in a process tube constituting a heat treatment apparatus. A predetermined heat treatment is performed for wafers by using a cylindrical heater arranged surrounding the process tube. In this case, in order to perform a uniform heat treatment for the surfaces of the individual wafers located at different positions in the process tube, a uniform heating area having a uniform temperature distribution is required to be formed inside the process tube. Two or three temperature sensors are arranged at different positions inside the process tube in a conventional heat treatment apparatus. Outputs from these temperature sensors are compared with desired output values from temperature sensors which are obtained when a predetermined uniform heating area is formed inside the process tube. Heating is controlled by using a computer so that the actual output values from the temperature sensors come close to the predetermined ideal output values.

The temperature sensors are fixed at predetermined positions inside the process tube. For this reason, the temperatures estimated by the temperature sensors are not as actually measured temperatures but as empirically predicted temperatures obtained from the indicating values of temperature sensors, thereby performing temperature control in the process tube by a heater.

As a result of various experiments, it is confirmed that temperature differences between the temperature sensors greatly influence an desired uniform heating area in the process tube. In particular, when the packing density of semiconductor devices is increased and their manufacturing process becomes complicated, this tendency becomes conspicuous.

SUMMARY OF THE INVENTION

It is an object of the present invention to provide a heat treatment apparatus and a heat treatment method capable of accurately measuring an internal temperature and easily controlling the internal temperature with high precision.

In order to achieve the above object of the present invention, there is provided a heat treatment apparatus comprising:

a process tube for receiving a plurality of objects arranged at predetermined intervals;

first temperature measuring elements having temperature sensing portions located with predetermined intervals for each other along a longitudinal direction of the process tube therein;

a second temperature measuring element having a temperature sensing portion movable along the longitudinal direction of the process tube;

heating means arranged outside the process tube;

heating temperature control means for comparing the temperature value obtained from said first and second temperature measuring elements with a predetermined an desired temperature distribution in the process tube to output a predetermined temperature increase or decrease signal to the heating means.

There is also provided a heat treatment method comprising the steps of:

controlling the temperature in a process tube to have a predetermined temperature distribution on the basis of signals supplied from temperature detectors arranged at predetermined intervals in a longitudinal direction of the process tube and of a signal supplied from another temperature detector movable in the longitudinal direction; and heat-treating a subject placed inside the process tube for a predetermined period of time.

The heat treatment method and apparatus according to the present invention are applicable to plasma treatment, oxidation, the film formation treatment, diffusion, plasma chemical vapor deposition treatment, and the like of semiconductor wafers.

The process tube may be of a horizontal or vertical type.

An inner cylinder which stores a boat for supporting semiconductor wafers and is movable along the longitudinal direction of the process tube is preferably arranged inside the process tube without contacting to the inner wall of the tube by using a techniques of a so-called softlanding.

The second temperature measuring element is arranged to be movable along the entire length of the uniform heating area in which columns of wafers are exist of the process tube.

The second temperature measuring element may be manually moved. However, it is preferably that the means for moving the inner cylinder is also used to move the second temperature measuring element.

The first and second temperature measuring elements preferably comprise, e.g., thermocouples.

The heating means preferably comprises a resistance heating.

The first temperature measuring elements are preferably arranged at least at both end portions and an intermediate portion of the uniform heating area in the process tube.

BRIEF DESCRIPTION OF THE DRAWINGS

FIG. 1 is a view showing an arrangement of a heat treatment apparatus according to an embodiment of the present invention;

FIG. 2 is a perspective view showing an arrangement of the temperature measuring elements in the heat treatment apparatus in FIG. 1;

FIG. 7 is an explanatory view showing how the temperature is controlled by the control computer.

DETAILED DESCRIPTION OF THE PREFERRED EMBODIMENTS

Figure 3:
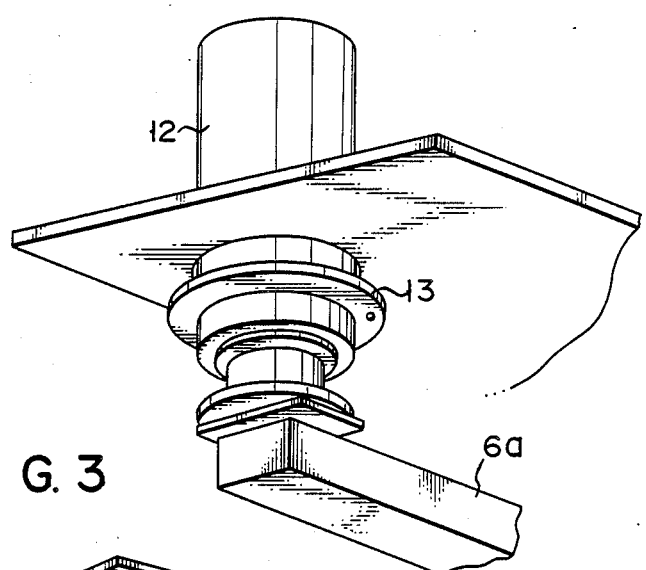
FIG. 3 is a perspective view of a mechanism for vertically moving an inner cylinder of a process tube.

FIG. 1 is a view showing an arrangement of a heat treatment apparatus according to an embodiment of the present invention. Referring to FIG. 1, reference numeral 1 denotes a process tube. The process tube 1 is of a vertical type and has a cylindrical shape. A small-diameter tube 1a for supplying an oxidation reaction gas to the interior of the process tube 1 is connected to the central upper portion of process tube 1. The oxidation reaction gas may be steam obtained by, e.g., combusting and chemical combining $H_2$ gas with $O_2$ gas. This process is well known as a technique used in oxidation furnace. A material of the process tube 1 is selected according to the treatment temperature, but is preferably quartz or SiC in this embodiment. An inner cylinder 12 made of the same material as that of the process tube 1 is vertically movable by a lift 6 in the process tube 1. The inner cylinder 12 extends upright on a base 13. Inner cylinder 12 has a function to prevent contaminants contacting with a inner wall of a process tube at the reaction. And inner cylinder 12 has a function to make uniform heating against heating by a heater. A wafer boat (not shown) which supports wafers 14 as objects to be processed can be placed on the base 13. Three holes 1b, 1c, and 1d are formed in the upper portion of the process tube 1, as shown in FIG. 2. First temperature measuring elements 2, 3, and 4 are suspended from the holes 1b, 1c, and 1d into the inner cylinder 12. First temperature measuring elements 2, 3, and 4 may be also inserted from the bottom of inner cylinder 12. The temperature measuring elements 2, 3, and 4 are arranged such that their temperature sensing portions are fixed at lower, middle, and upper regions in the inner cylinder 12. The lower, middle, and upper regions from a uniform heating area for performing a heat treatment of the wafer 14.

The first temperature measuring elements 2, 3, and 4 can be constituted by, e.g., thermocouples.

Figure 4A:
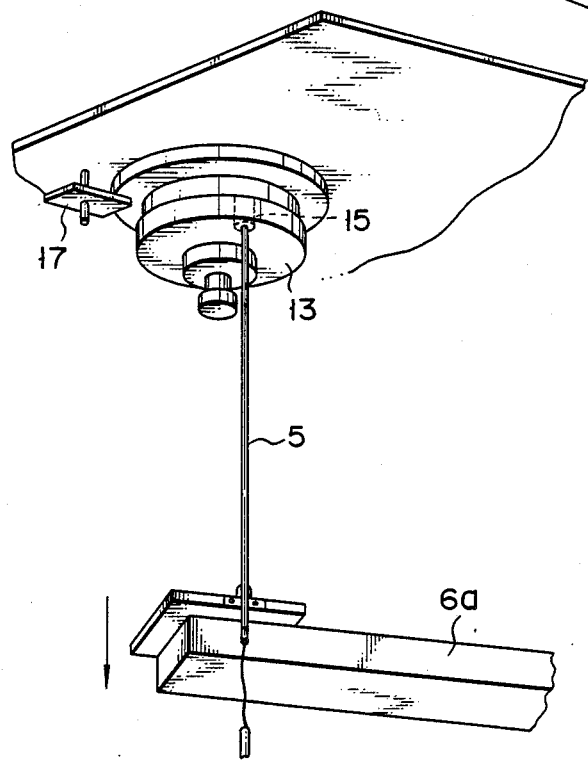
FIG. 4 is a perspective view showing a state in which a temperature measuring element is mounted.
FIG. 4B is a perspective view showing a guide of the temperature measuring element.
FIG. 4C is an exploded perspective view of a mounting piece of the temperature measuring element.
Figure 4B:
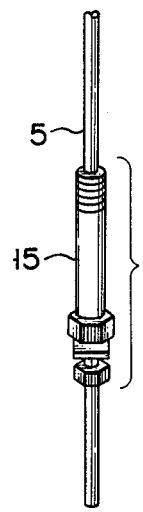
Figure 4C:
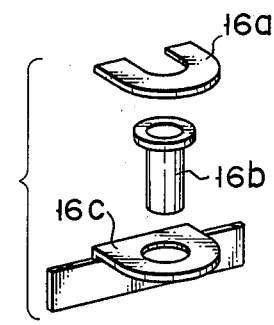

A second temperature measuring element 5 extends upright through the base 13. Second temperature measuring element 5 may extend perpendicular to the inner wall of inner cylinder 12. The temperature detection portion as the distal end portion of the temperature measuring element 5 is vertically movable along an inner wall surface of the inner cylinder 12 within the uniform heating area. That is, the inner cylinder 12 is vertically movable upon operation of a lifting arm 6a shown in FIG. 3. The temperature measuring element 5 extends through a guide cylinder 15 extending through the base 13 and is held by mounting pieces 16a, 16b, and 16c mounted on the side portion of the lifting arm 6a, as shown in FIGS. 4A and 4B. For this reason, when the lifting arm 6a is moved upward to store the inner cylinder 12 to a predetermined position of the process tube 1, the portion of the base 13 is supported by a fastener 17 to fix the inner cylinder 12 in the process tube 1, as shown in FIG. 4A. Thereafter, the lifting arm 6a is moved downward to move the temperature measuring element 5 downward along the inner wall surface of the inner cylinder 12. Therefore, the second temperature measuring element 5 can be continuously moved along the upper, middle, and lower regions of the uniform heating area of the inner cylinder 12. The second temperature measuring element 5 may be also movable in a certain moving interval. As a result, continuous temperature measurement throughout the entire uniform heating area can be performed by the second temperature measuring element 5. The second temperature measuring element 5 is constituted by, e.g., a thermocouple.

A boat which supports a predetermined number of wafers 14 is stored in the inner cylinder 12, and the inner cylinder 12 is stored in the process tube 1 by the lift 6. In the case where a uniform heating area is produced, with the temperature in an oven maintained at 800° C., the following procedures are carried out. First, the predetermined uniform heating area of the process tube 1 is heated to a predetermined temperature by a resisting heater 18 arranged outside the process tube 1. Temperatures at the upper, middle, and lower regions inside the inner cylinder 12 are measured by the first temperature measuring elements 2, 3, and 4, respectively. Predetermined signals obtained on the basis of the measured temperatures are supplied to a control computer 20 shown in FIG. 1.

If the signals from temperature measuring elements 2, 3, and 4 indicate temperatures higher than 800° C., then the control computer 20 controls the output of the heater 18 until the temperatures are lowered to 800° C. The heating temperature of the heater 18 is controlled, for example by use of an external thermoelectric couple (not shown).

Next, temperatures of the entire uniform heating area from the upper direction to the lower direction in the inner cylinder 12 are measured while the second temperature measuring element 5 is vertically moved by the lift 6. Predetermined signals obtained on the basis of the measured temperatures are supplied to the computer 20. A downward moving speed of the second temperature measuring element 5 is set to be, e.g., 30 mm/sec.

The temperature sensing element 5 may be moved before and after the reaction for the distance corresponding to the reaction period.

An output produced from each temperature sensing element (2, 3, 4, 5) is amplified to a predetermined value. Next, the amplified output is supplied to the comparator 21, as is shown in FIG. 7, so as to compare it with reference data 22 preset and stored beforehand. The difference between the output signal and the reference data is supplied to the control computer 23. When the difference becomes zero, control signals which are to be used for controlling the heaters 18a, 18b and 18c are determined. On the basis of these control signals, the current supply to the heaters 18a, 18b, and 18c is controlled for temperature control.

Figure 5:
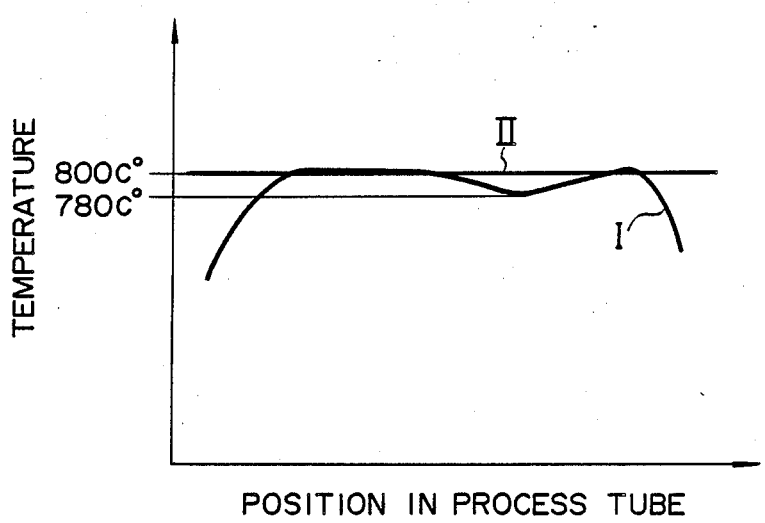
FIG. 5 is a graph representing the relationships between the position in the process tube and the temperature.

The control computer 20 determines the temperatures of the upper, middle, and lower regions of the uniform heating area and between these regions. As a result, a temperature distribution throughout the uniform heating area is checked. The temperature distribution (I) of the uniform heating area thus obtained and the temperature distribution (II) of the 800° C. uniform heating area can be recorded by use of the outputs of the control computer (20), as is shown in FIG. 5. These two temperature distributions (I) and (II) are compared with each other by the control computer 20. If the heating area includes a region whose temperature is lower than 800° C. (e.g., a region whose temperature is 780° C.), the control computer 20 supplies a temperature increase signal to the heater 18. When the temperatures indicated by the first and second temperature measuring elements 2, 3, 4, and 5 have become 800° C., the control computer 20 determines that the desirable uniform heating are is obtained.

In this manner, temperature measurement inside the process tube 1 is accurately performed, and internal temperature control can be easily performed with high precision.

In this embodiment, the second temperature measuring element 5 and the inner cylinder 12 are vertically moved by the single lift 6. However, lifts may be used for the second temperature measuring element 5 and the inner cylinder 12, respectively. And lifts may be done continuously or periodically. The second temperature measuring element 5 may be vertically moved by a manual operation.

Temperature measurement of the entire uniform heating area by the second measuring element 5 can be performed during upward movement of the second temperature measuring element 5 or by an average value after a combination of upward movement and downward movement.

Figure 6:
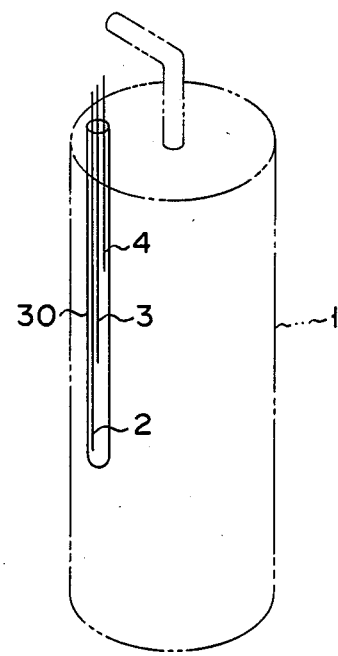
FIG. 6 is an explanatory view of an element-storing tube which stores first temperature measuring elements.

The first temperature measuring elements 2, 3, and 4 may be inserted in the process tube after arranging them in an element-storing tube at predetermined intervals, as is shown in FIG. 6.

The present invention is also applicable to a horizontal type heat treating apparatus.

Furthermore, the process tube may constitute any furnace such as an oxidation or diffusion furnace.

What is claimed is:

1. A heat treatment apparatus comprising:
   a vertically arranged process tube for receiving a plurality of objects arranged at predetermined intervals;
   a plurality of first temperature measuring elements having temperature sensing portions located at predetermined intervals with respect to each other said process tube and along within a longitudinal direction thereof;
   a second temperature measuring element in said process tube and having a temperature sensing portion movable along the longitudinal direction of said process tube;
   heating means arranged outside said process tube;
   heating temperature control means for comparing the temperature value obtained from said first and second temperature measuring elements with a predetermined desired temperature distribution in said process tube to output a predetermined temperature increase or decrease signal to said heating means.

2. An apparatus according to claim 1, wherein an inner cylinder for storing the objects is vertically movable in said process tube.

3. An apparatus according to claim 2, wherein means for vertically moving said second temperature measuring element and mean for vertically moving said inner cylinder are driven by a single lift.

4. An apparatus according to claim 1, wherein said first and second temperature measuring elements comprise thermocouples, respectively.

5. An apparatus according to claim 1, wherein said process tube is an oxidation or diffusion furnace.

6. An apparatus according to claim 1, wherein the objects are semiconductor wafers.

7. An apparatus according to claim 1, wherein a movement area of said second temperature measuring element extends throughout a length of a uniform heating area formed inside said process tube.

8. An apparatus according to claim 1, wherein said first temperature elements are arranged at least at both ends and an intermediate regions of a uniform heating area.

9. A heat treatment method, comprising the steps of:
   controlling the temperature in a vertically arranged process tube to have a predetermined temperature distribution on the basis of signals supplied from temperature detectors arranged at predetermined intervals within said process tube and along a longitudinal direction thereof and of a signal supplied from another temperature detector movable in the longitudinal direction; and
   heat-treating a subject placed inside the process tube for a predetermined period of time.

* * * * *